(12) United States Patent
Moroz et al.

(10) Patent No.: US 7,691,693 B2
(45) Date of Patent: Apr. 6, 2010

(54) METHOD FOR SUPPRESSING LAYOUT SENSITIVITY OF THRESHOLD VOLTAGE IN A TRANSISTOR ARRAY

(75) Inventors: Victor Moroz, Saratoga, CA (US); Dipankar Pramanik, Saratoga, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 11/757,294

(22) Filed: Jun. 1, 2007

(65) Prior Publication Data

US 2008/0296698 A1  Dec. 4, 2008

(51) Int. Cl.
*H01L 21/338* (2006.01)
(52) U.S. Cl. ............... 438/174; 438/194; 438/289; 257/376; 257/487; 257/E29.263
(58) Field of Classification Search ............... 438/174, 438/194, 289; 257/376, 487, E29.263
See application file for complete search history.

(56) References Cited

U.S. PATENT DOCUMENTS

| | | | |
|---|---|---|---|
| 4,769,686 A * | 9/1988 | Horiuchi et al. | 257/373 |
| 5,098,852 A | 3/1992 | Niki et al. | |
| 5,592,012 A * | 1/1997 | Kubota | 257/391 |
| 6,590,230 B1 | 7/2003 | Yamazaki et al. | |
| 7,259,079 B2 | 8/2007 | Bai et al. | |
| 7,514,366 B2 | 4/2009 | Trivedi et al. | |
| 7,521,763 B2 | 4/2009 | Kim et al. | |
| 7,538,351 B2 | 5/2009 | Chen et al. | |
| 2002/0022326 A1* | 2/2002 | Kunikiyo | 438/296 |
| 2005/0151181 A1 | 7/2005 | Beintner et al. | |
| 2006/0017138 A1* | 1/2006 | Ting | 257/632 |
| 2006/0199398 A1 | 9/2006 | Sugawara et al. | |

FOREIGN PATENT DOCUMENTS

| | | |
|---|---|---|
| JP | 03-038044 | 2/1991 |
| JP | 08-078682 | 3/1996 |
| JP | 11-168069 | 6/1999 |

OTHER PUBLICATIONS

Wolf, Silicon Processing for the VLSI Era, vol. 2, Contents and chapter 1, 1990.*
International Search Report, PCT/US08/51358, mailed Jun. 27, 2008.
Griffin, P. B. et al., "Process Physics Determining 2-D Impurity Profiles in VLSI Devices," IEEE, 1986, pp. 522-525.
H. Fukutome et al., "Direct Measurement of Effects of Shallow-Trench Isolation on Carrier Profiles in Sub-50 nm N-MOSFETSs," 2005 Symposium on VLSI Technology Digest of Technical Papers, pp. 140-141.

(Continued)

*Primary Examiner*—Thanh V Pham
(74) *Attorney, Agent, or Firm*—Warren S. Wolfeld; Haynes Beffel & Wolfeld LLP

(57) ABSTRACT

A method for smoothing variations in threshold voltage in an integrated circuit layout. The method begins by identifying recombination surfaces associated with transistors in the layout. Such recombination surfaces are treated to affect the recombination of interstitial atoms adjacent such surfaces, thus minimizing variations in threshold voltage of transistors within the layout.

11 Claims, 7 Drawing Sheets

OTHER PUBLICATIONS

Moroz, Victor et al., "Suppressing Layout-Induced Threshold Variations by Halo Engineering," presented at 210 th Meeting of the Electrochemical Society, Cancun, Mexico, Oct. 29-Nov. 3, 2006, 6 pp.

Non-Final Rejection mailed Jan. 23, 2009 in U.S. Appl. No. 11/757,294.

International Search Report mailed Oct. 29, 2008 in PCT/US2008/071572.

* cited by examiner

METHOD FOR SUPPRESSING LAYOUT SENSITIVITY OF THRESHOLD VOLTAGE IN A TRANSISTOR ARRAY

BACKGROUND

The invention relates to integrated circuit devices, and more particularly to the suppression of layout sensitivity in a transistor array.

It has long been known that semiconductor materials such as silicon and germanium exhibit the piezoelectric effect (mechanical stress-induced changes in electrical resistance). See for example C. S. Smith, "Piezoresistance effect in germanium and silicon", Phys. Rev., vol. 94, pp. 42-49 (1954), incorporated by reference herein. It has also been observed that stress variations in a transistor array can produce variations in carrier mobility, which in turn leads to variations in threshold voltage in the transistors of the array. That problem, and a solution for it, are set out in U.S. patent application Ser. No. 11/291,294, entitled "Analysis of Stress Impact on Transistor Performance", assigned to the assignee hereof.

Further study has shown, however, that beyond stress some variation in threshold voltage remains, suggesting some additional factor at work. Variations encountered have been far from trivial, with swings of over 20 mV being common. The art has not suggested any potential causes for such problems, not has it presented solutions. Thus, it has remained for the present inventors to discover the cause of such variations and to devise solutions, all of which are set out below.

SUMMARY

An aspect of the claimed invention is a method for smoothing variations in threshold voltage in an integrated circuit. The method begins by identifying recombination surfaces associated with transistors in the MOSFET array. Such recombination surfaces are treated to affect the recombination of interstitial atoms adjacent such surfaces, thus minimizing variations in threshold voltage of transistors within the array

DETAILED DESCRIPTION

The following detailed description is made with reference to the figures. Preferred embodiments are described to illustrate the present invention, not to limit its scope, which is defined by the claims. Those of ordinary skill in the art will recognize a variety of equivalent variations on the description that follows.

Figure 1A:
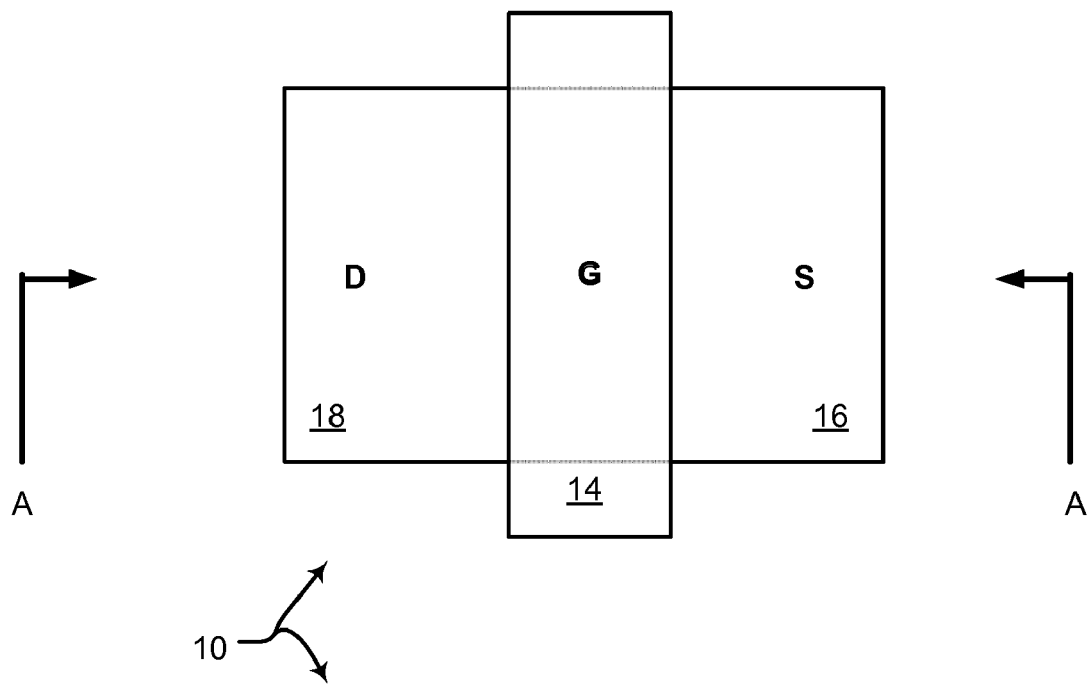
FIG. 1a illustrates an embodiment of a single transistor constructed according to the claimed invention.
Figure 1A:
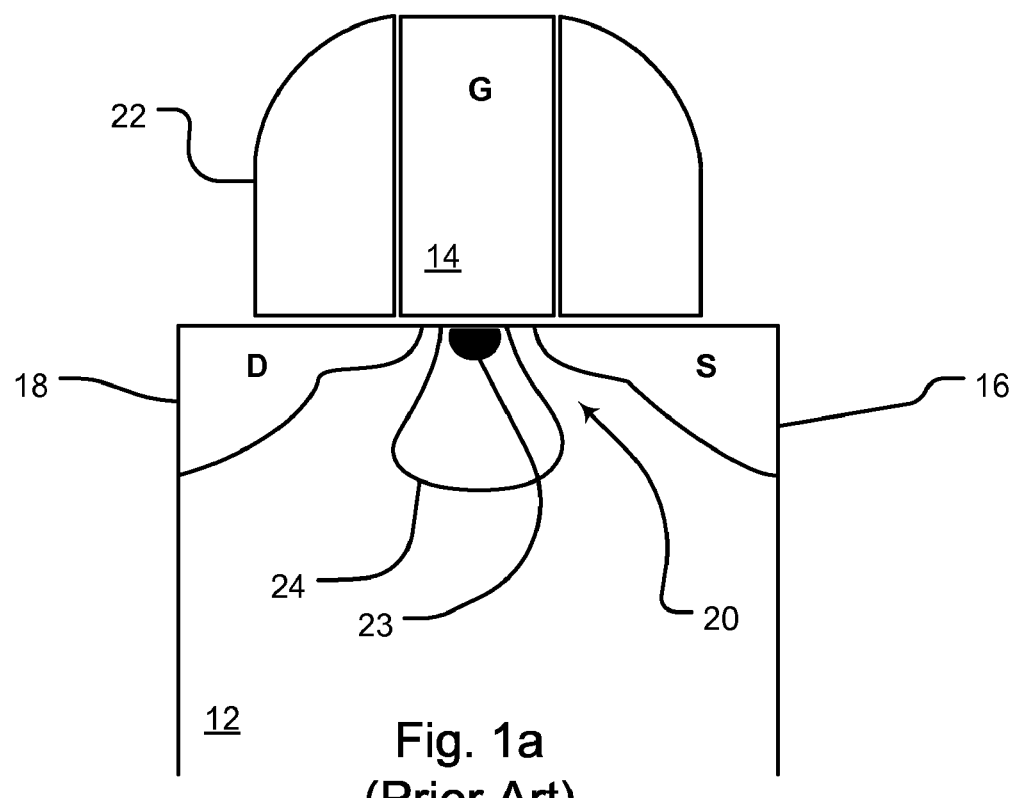

The claimed invention can best be understood by first considering an illustrative MOS transistor 10, shown in FIG. 1a, which shows both a plan view (upper portion) and a cross-section taken on line A-A (bottom portion). There, a diffusion region 12 includes a source region 16 and drain region 18 formed in the diffusion region, with a gap between these regions overlain by a gate 14. The area under the gate is the channel 20. Spacers 22 lie on either side of the gate (not shown in plan view). It will be understood that materials and fabrication techniques relating to these components, and to the MOS device as a whole, are wholly known in the art and are thus not described in any detail here. It is anticipated that the array would be formed in a Partially Depleted, Silicon-on-Insulator (PDSOI MOSFET) substrate, but the teachings of the present application apply to bulk configurations as well. It will be noted that the drawings depict bulk MOSFET devices. Further, it is well-known in the art that the MOSFET channel is doped to adjust the threshold voltage that determines when the MOSFET turns on and off. Channel dopants employed in typical MOSFET devices include species such as boron. The embodiment depicted in FIG. 1a has been so modified, employing ion implantation techniques in general use. The resulting concentration of B atoms in the crystal lattice of the diffusion region is represented by concentration plot, which depicts an inner high-concentration zone and an outer minimal concentration pattern. As is generally known, concentration of dopant decreases from a high concentration zone 23 near the channel surface, generally outward into the channel, to a selected minimal concentration level 24. The concentration levels 23 and 24 are lines of equal dopant concentration within the channel, grading from the regular, smooth curve of the maximum concentration area and grading to the irregular form of minimal concentration plot 24. Although not shown, those in the art will understand that concentration grades from maximum at line 23 to minimal at line 24. The transistor arrays discussed below employ a number of individual transistors, constructed as set out here. Details related here will be omitted for the sake of focus and clarity in the discussion that follows.

Figure 1B:
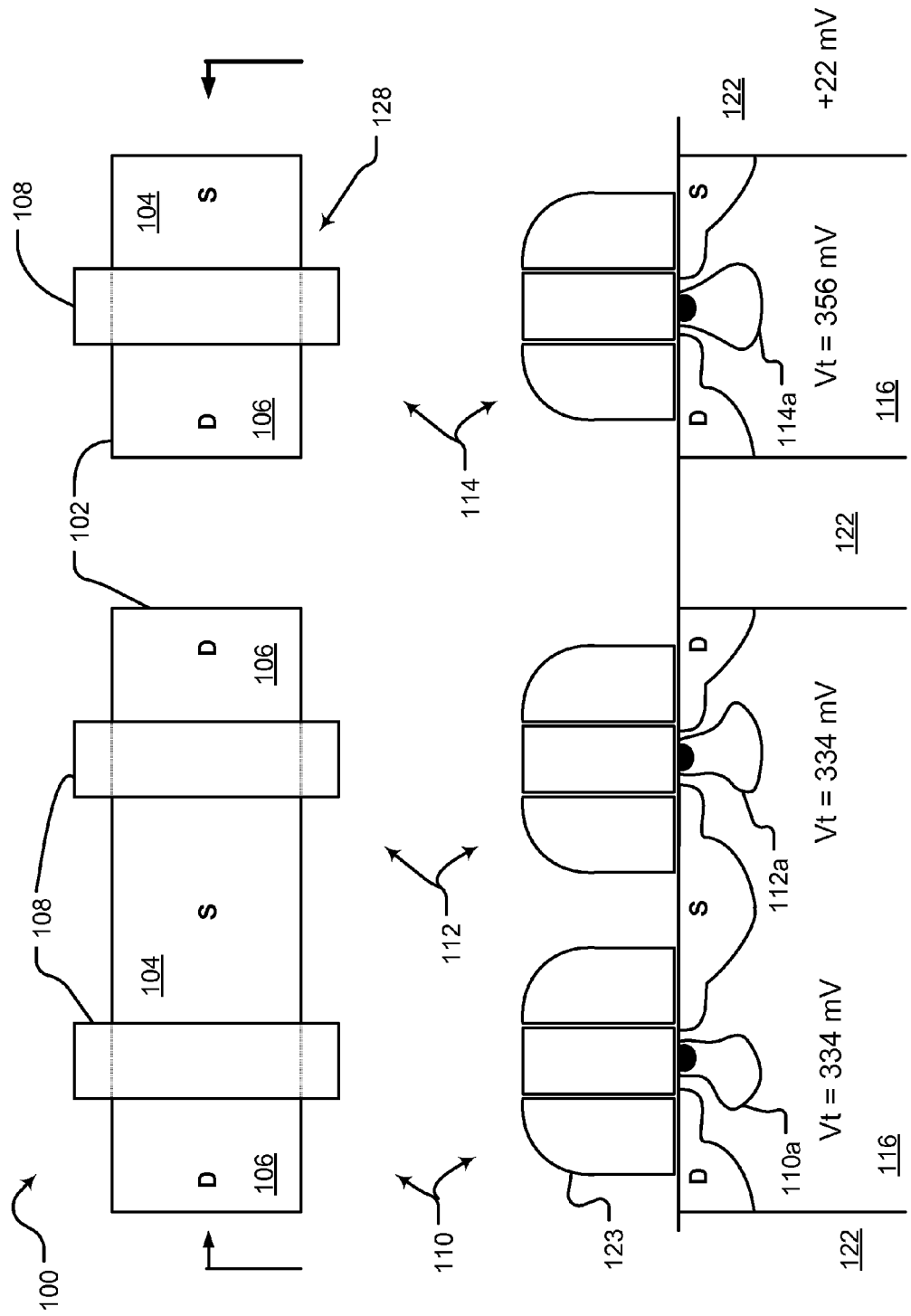
FIG. 1b illustrates an embodiment of a transistor array constructed according to the claimed invention.

FIG. 1b depicts an array 100 of three transistors 110, 112 and 114. As previously described, the array is shown both in plan and cross-section views and each individual transistor is constructed consistent with the description above. As is commonly seen, a transistor array is formed on a chip, on which are formed a number a relatively large diffusion regions 102. These regions have appropriate dopants added, by conventional processes such as ion implantation, to produce extensive source and drain regions 104 and 106, respectively. Finally, gate material 108 is overlaid in strips. Transistors are isolated to prevent any cross-coupling, by areas of oxide insulator material, such as the Shallow Trench Isolation (STI) areas 122. As the name implies, any suitable insulator can be used in an STI, but tetraethyl orthosilicate (TEOS) is preferred. It should be noted that the nature of integrated circuits will result in some individual transistors being isolated by themselves, such as transistor 114, while others are nested into groups of two or more, such as transistors 110 and 112.

Surprisingly, it has been found that even after eliminating stress-induced threshold voltage variations, a large amount of variation remained within a transistor array. As reflected in FIG. 1b, measurements in a typical array revealed $V_t$ variation from 334 mV to 356 mV, a swing of 22 mV. Initial investigation did not immediately uncover the cause of this variation, but it was noted that the variation primarily occurred between individual isolated transistors, such as transistor 114, and those in nested groups, such as transistors 110 and 112.

Figure 2:
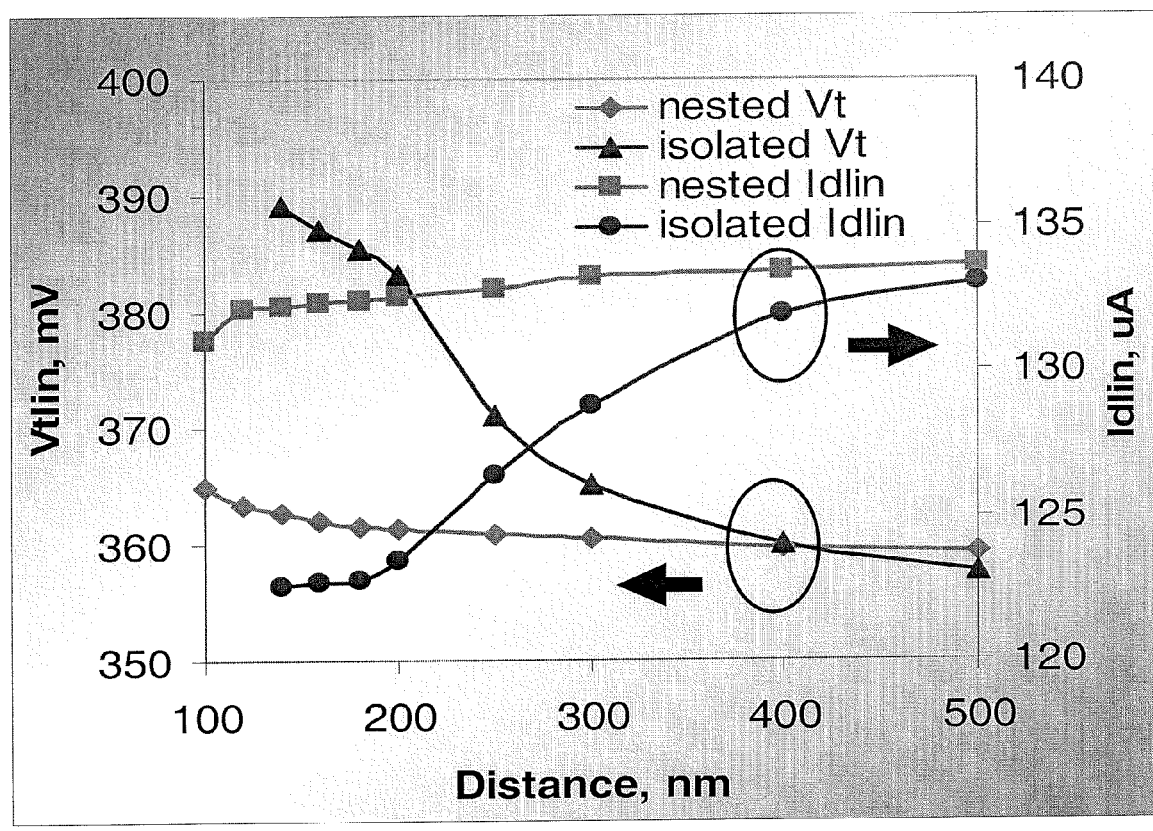
FIG. 2 is a plot of threshold voltage and drain current as functions of the distance from the channel to an STI interface (for isolated transistors) or to the next transistor (for nested transistors)

It was noted that one difference between a point in the channels of transistors 110 and 112, compared to a similar point in transistor 114 is the distance from such a point to the two surrounding STI walls. Further investigation led to the data charted in FIG. 2, which shows both $V_t$ and $I_d$ as functions of distance (in nm) from the channel to surrounding STI walls (for isolated MOSFETs such as transistor 114), and to the next MOSFET (for nested elements such as transistors 110 and 112). As shown, at the distances seen in current fabrication technologies, from 100-200 nm, considerable variation exists, but that variation reduces steadily with increasing distance, and becomes negligible at distances of about 500 nm.

A clue to what is happening at the lattice level can be gained by returning to FIG. 1b. The bottom portion of that drawing includes plots of channel dopant concentration, 110a, 112a, and 114a. As noted above, dopant such as boron is implanted in channel 128 to adjust threshold voltage. That operation generally is accomplished by ion implantation. Although the implantation for transistors 110, 112, and 114 proceeded identically, one can observe an interesting result in FIG. 1b. Namely, the concentration of dopant, as shown by the shape of the profile, skews toward the nearer STI wall. Thus, in profile 110a, the dopant concentration tilts toward the left, on the drawing page, while that of profile 112a tilts in the opposite direction, to right. In contrast, isolated transistor 114 displays a symmetrical concentration pattern 114a, tilting in neither direction.

Figure 3:
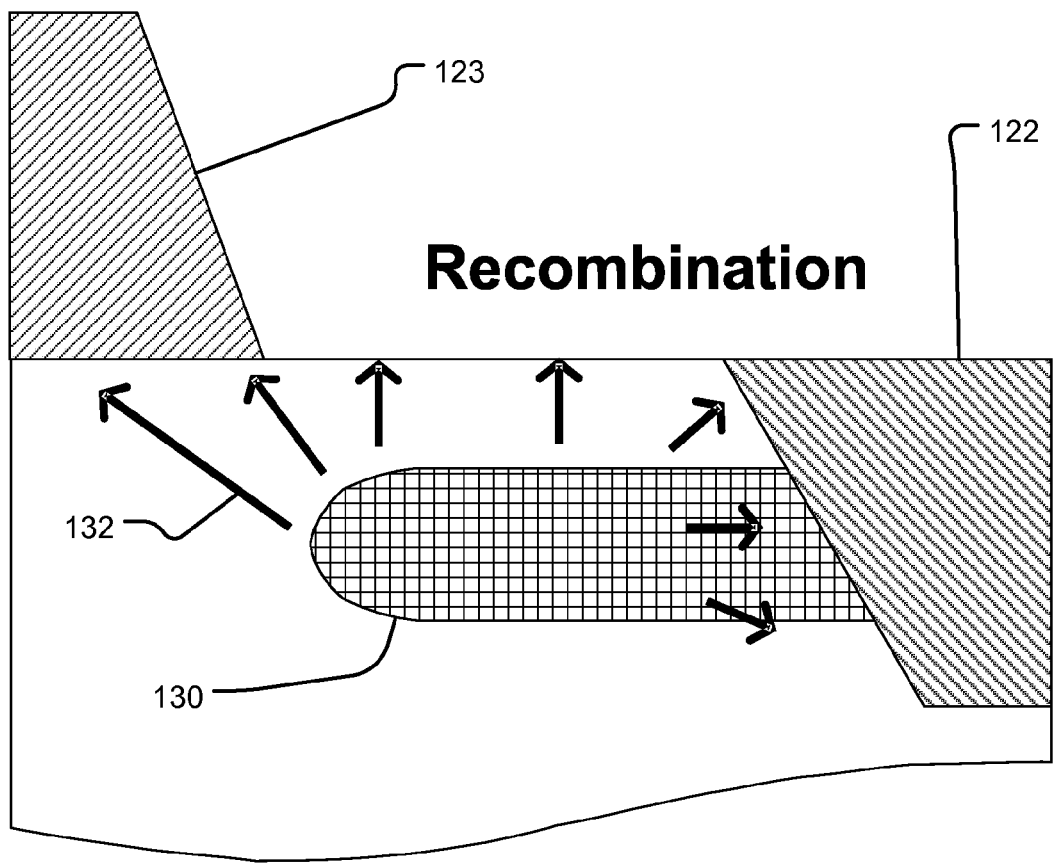
FIG. 3 depicts the recombination of interstitial ions during annealing, to repair lattice damage.

Based on these results, it was hypothesized that the issue could relate to recombination of damaged areas in the crystal lattice. As shown in FIG. 3, and as noted above, dopants (such as boron, phosphorous or arsenic) are introduced into the source and drain regions, usually by ion implantation, to create highly conductive layers in that area. The implantation process produces a damaged area 130 in the target crystal lattice, where the newly implanted ions have displaced the ions (generally Si ions) previously occupying crystal lattice ion sites but the displaced ions are still present within the lattice, as interstitial ions. It is further known that the displaced interstitials tend to migrate through a diffusion process toward a surface of the crystal structure, such as the interface between the crystal structure and the STI 122, or interface between silicon channel and gate stack 123, where displaced ions can recombine at the channel surface onto free Si lattice sites that characterize a surface area. This occurs at elevated temperature during the application of the thermal annealing process. Ion paths in FIG. 3 are shown by arrows 132. As can be seen, the distance that individual ions must travel to reach a surface and there recombine are different, which makes it more likely that ions located near such a surface will be able to recombine quickly. Before the interstitials displaced by the implantation recombine at the silicon surfaces, they move around and enhance diffusivity of the dopants like boron, phosphorus, or arsenic. This phenomenon is known as Transient Enhanced Diffusion (TED). The amount of TED that the dopants experience in the channel determines the concentration of dopants near the channel surface, and therefore determines the threshold voltage. Therefore, recombination of interstitials at different silicon surfaces affects threshold voltages of the adjacent MOSFETs.

Referring back to FIG. 1b, it will be appreciated that the expected recombination pattern for interstitial ions in the channel of transistor 114 would be symmetrical, as the distances to an STI wall are the same on either side of that transistor. For transistors 110 and 112, however, application of this discovery would lead one to expect concentration patterns skewed toward the STI wall, and in fact that is exactly the result found.

Figure 4:
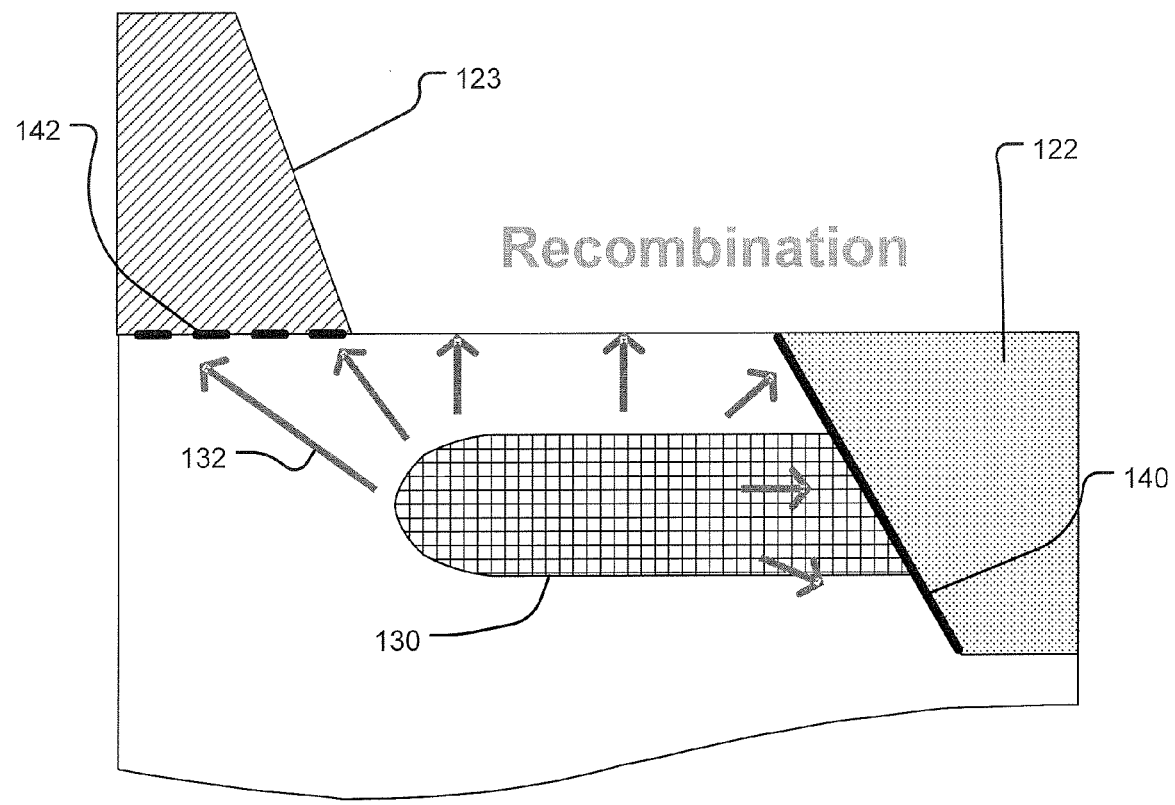
FIG. 4 depicts the recombination process shown in FIG. 3, with the addition of enhancing and suppression regions according to the claimed invention.

FIG. 4 illustrates a solution to the variation problem presented by the transistor structure of FIG. 3. At the interface between the crystal structure and the STI, there is added a layer of material 140 that suppresses recombination of displaced silicon ions. Several materials are known to possess properties that would serve in this role. Notably, an oxide layer containing species such as N or F would tend to suppress interstitial recombination. The exact amounts of these elements required in a specific application to even out the TED effects between sides of a transistor adjacent to an STI wall and the side distant from such a structure. In one embodiment, oxynitrides are employed, produced by adding N to $SiO_2$. Additionally, the TEOS in an STI could be replaced by nitride, or a nitride liner could be applied before the STI is deposited, producing a layer 140. In either instance, nitride would suppress interstitial recombination.

In addition to, or instead of suppression recombination at the STI interface, recombination could be enhanced at the gate interface 142. A sufficient enhancement would have the identical effect as suppression at the STI. One embodiment of the claimed invention employs materials including high-K dielectric material such as hafnium oxide ($HfO_2$).

Finally, it is possible to select dopants that are insensitive to interstitial-driven TED effects, such as arsenic and antimony. Such species diffuse in Si mainly by interacting with lattice vacancies rather than with interstitials. Thus, they are less sensitive to TED, which in turn results in lowered sensitivity to layout variations in threshold voltage. As in known by those in the art, implantation creates excess interstitials, not excess vacancies, and thus the number of vacancies is determined by the annealing temperature.

Figure 5:
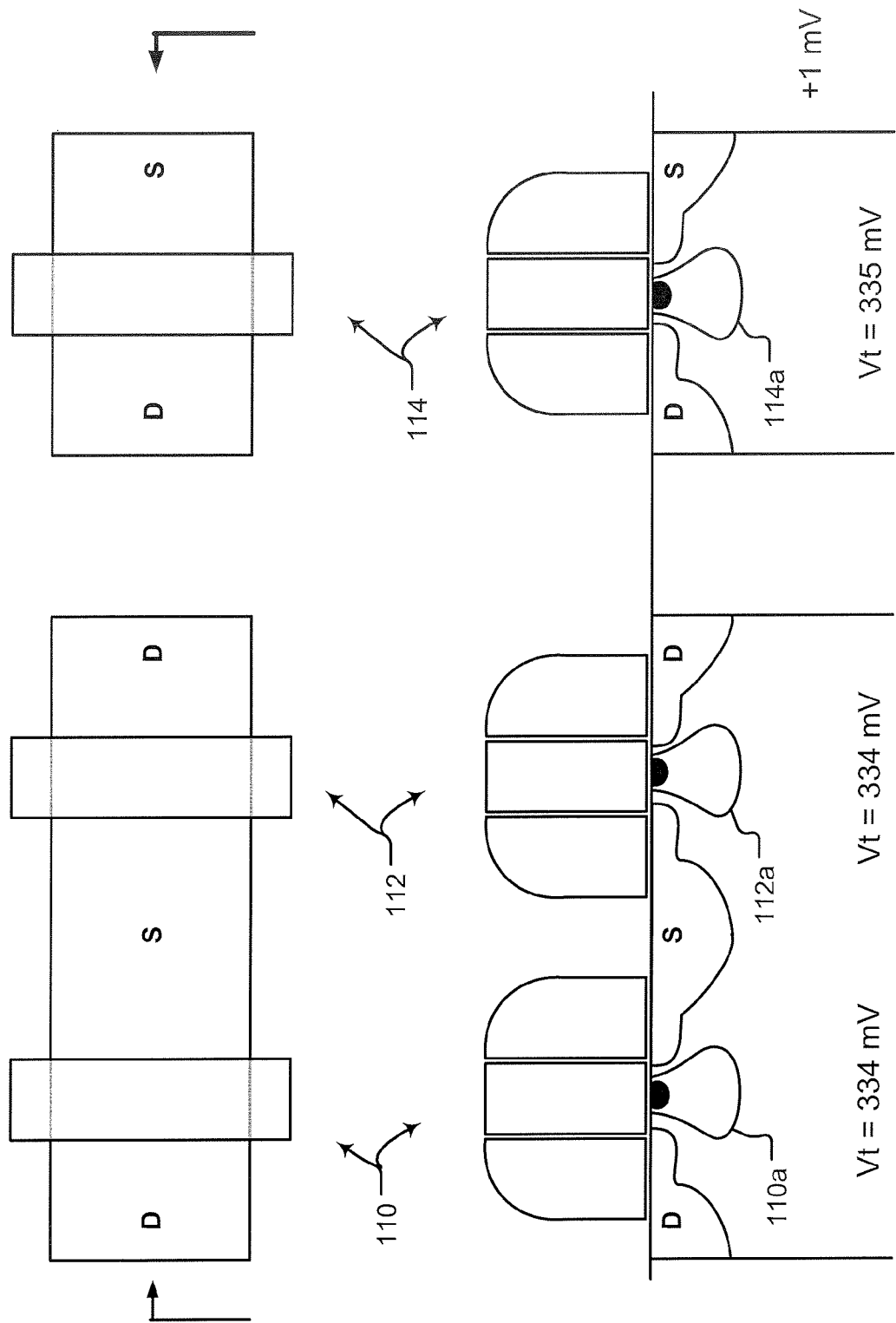
FIG. 5 shows the results achieved by the claimed invention, reflected in the ion concentration patterns at each transistor, in which the interstitial recombination rate is high at the channel/gate oxide interface and low at the silicon/STI interface.

FIG. 5 illustrates the results of balancing the recombination of interstitial ions. The interstitial recombination rate at the channel/gate oxide interface is high, whereas it is low at the silicon/STI interface. As can be seen, the ion concentration profiles 110a, 112a and 114a are all symmetrical and very similar to each other. Confirming the hypothesis underlying the claimed invention, it can also be seen that the measured $V_t$ across the three transistors now varies by only a single mV, not 22 mV.

Figure 6:
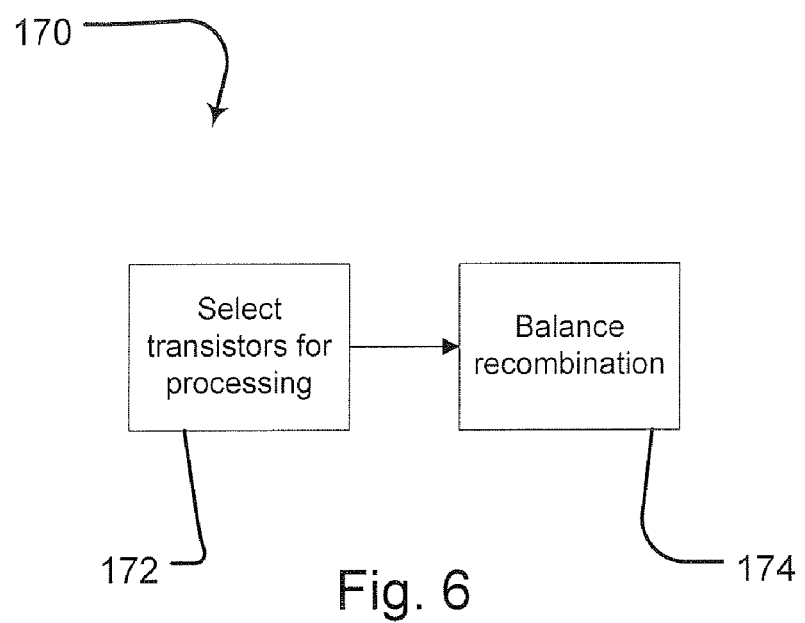
FIG. 6 is a process flowchart of the method according to the claimed invention.

A process 170 for implementing the claimed invention is shown in FIG. 6. As seen there, the process includes two basic steps: First, in step 172, the MOSFET array is analyzed to select those individual transistors that require further processing. Then, in step 174, action is taken to balance the recombination rate. Each of those steps need consideration in detail.

The analysis and selection step requires determination of which transistors are likely to exhibit imbalances. It is the discovery underlying the claimed invention that one can accurately select such transistors as those in nested configurations—that is, those transistors having another transistor adjacent on one side and an STI adjacent to the other side. That configuration, it has been found, requires action. Fortunately, that configuration is straightforward to identify in a transistor array, making it a simple matter to make such a selection from a system layout, using any of a number of automated design programs. In one embodiment, it is preferred to apply both suppression and enhancement measures globally to the entire MOSFET array. Other embodiments employ the measures singly—that is, employing either recombination enhancement at the gate surface or recombination suppression at the Si/STI interface, but not both. Yet other embodiments use analysis tools to identify particular target devices or sets of devices where enhancement or suppression, or both, would be most helpful.

Step 174 requires the implementation of one of the processes identified above to accomplish the rebalancing of recombination rates. For example, in one embodiment the TEOS material of the STI is replaced by nitride, or in another embodiment a nitride layer is deposited in the STI trench before the primary oxide is deposited. In other embodiments, the balancing step is accomplished by enhancing recombination at the gate interface. One method for accomplishing that would be to increase the permittivity of the oxide layer (increase k). Such an increase can be achieved by substituting oxynitride for the $SiO_2$ in the gate oxide, producing a medium-k material that offered enhanced recombination. Another embodiment first deposits or grows $SiO_2$, followed by a layer of high-k material, such as $HfO_2$. In either event, it will be helpful to avoid employing a nitrogen-based material, which would tend to suppress recombination.

Yet another embodiment proceeds by combining both enhancement of recombination at the gate interface and suppression at the STI interface.

While the present invention is disclosed by reference to the preferred embodiments and examples detailed above, it is understood that these examples are intended in an illustrative rather than in a limiting sense. It is contemplated that modifications and combinations will readily occur to those skilled in the art, which modifications and combinations will be within the spirit of the invention and the scope of the following claims.

We claim as follows:

1. A method for smoothing variations in threshold voltage in an integrated circuit, comprising the steps of:
   selecting fewer than all of the transistors in a MOSFET array for treatment to affect their threshold voltages;
   identifying recombination surfaces associated with the selected transistors in the MOSFET array; and
   treating the identified recombination surfaces to affect the recombination of interstitial atoms adjacent such surfaces in a manner that reduces variations in threshold voltage of transistors within the MOSFET array,
   wherein the step of selecting fewer than all of the transistors in a MOSFET array comprises the step of selecting those transistors in the array that have an asymmetry in the recombination rate of interstitials.

2. A method according to claim 1 wherein the treating step includes the step of treating the gate electrode adjacent to an identified surface to enhance the recombination of interstitial atoms adjacent to such surfaces.

3. A method according to claim 1, wherein the treating step includes the step of treating Si/STI interfaces to suppress the recombination of interstitial atoms adjacent such interfaces.

4. A method according to claim 1, wherein the treating step includes the steps of
   treating Si/STI interfaces to suppress the recombination of interstitial atoms adjacent such surfaces; and
   treating the gate electrode adjacent to an identified surface to enhance the recombination of interstitial atoms adjacent to such interfaces.

5. A method according to claim 2, wherein the treating step includes treating the gate electrode adjacent to an identified surface by introducing high-k material to the gate material to enhance the recombination of interstitial atoms adjacent to such surfaces.

6. A method according to claim 2, wherein the treating step includes treating the gate electrode adjacent to an identified surface by creating a layer of medium-k oxide to enhance the recombination of interstitial atoms adjacent to such surfaces.

7. A method according to claim 3, wherein the treating step includes treating Si/STI interfaces by introducing N atoms adjacent the interface to suppress the recombination of interstitial atoms adjacent such interfaces.

8. A method according to claim 3, wherein the treating step includes treating Si/STI interfaces by employing oxynitride materials in the STI to suppress the recombination of interstitial atoms adjacent such interfaces.

9. A method according to claim 3, wherein the treating step includes treating Si/STI interfaces by forming the STI having a nitride liner adjacent the interface to suppress the recombination of interstitial atoms adjacent such interfaces.

10. A method according to claim 3, wherein the treating step includes treating Si/STI interfaces by introducing F atoms adjacent the interface to suppress the recombination of interstitial atoms adjacent such interfaces.

11. A method according to claim 1, wherein the step of selecting those transistors in the array that have an asymmetry in the recombination rate of interstitials comprises the step of selecting those transistors in the array which on one side border an STI region and on the other side border another transistor.

* * * * *